(12) United States Patent
Zhang

(10) Patent No.: US 8,304,811 B2
(45) Date of Patent: Nov. 6, 2012

(54) HEMT DEVICE AND A MANUFACTURING OF THE HEMT DEVICE

(75) Inventor: Naiqian Zhang, Xi'an (CN)

(73) Assignee: Dynax Semiconductor, Inc., Xi'an (CN)

( * ) Notice: Subject to any disclaimer, the term of this patent is extended or adjusted under 35 U.S.C. 154(b) by 10 days.

(21) Appl. No.: 12/997,519

(22) PCT Filed: Mar. 4, 2009

(86) PCT No.: PCT/CN2009/070627
§ 371 (c)(1),
(2), (4) Date: Dec. 10, 2010

(87) PCT Pub. No.: WO2009/149626
PCT Pub. Date: Dec. 17, 2009

(65) Prior Publication Data
US 2011/0089468 A1    Apr. 21, 2011

(30) Foreign Application Priority Data

Jun. 13, 2008    (CN) .......................... 2008 1 0110136

(51) Int. Cl.
H01L 29/66 (2006.01)
(52) U.S. Cl. ................................ 257/194; 257/E29.246
(58) Field of Classification Search ........... 257/E29.246, 257/E29.247, E29.248, E29.265, 192, 194
See application file for complete search history.

(56) References Cited

U.S. PATENT DOCUMENTS

| 6,787,826 B1 | 9/2004 | Tserng et al. | |
| 2005/0133816 A1* | 6/2005 | Fan et al. | 257/190 |
| 2006/0102926 A1* | 5/2006 | Kikkawa et al. | 257/103 |
| 2006/0226412 A1* | 10/2006 | Saxler et al. | 257/11 |
| 2007/0278518 A1* | 12/2007 | Chen et al. | 257/192 |
| 2008/0308843 A1* | 12/2008 | Twynam | 257/191 |
| 2009/0045438 A1* | 2/2009 | Inoue et al. | 257/192 |
| 2009/0057720 A1* | 3/2009 | Kaneko | 257/194 |
| 2009/0072272 A1* | 3/2009 | Suh et al. | 257/194 |
| 2009/0146185 A1* | 6/2009 | Suh et al. | 257/194 |
| 2009/0267078 A1* | 10/2009 | Mishra et al. | 257/76 |
| 2010/0187570 A1* | 7/2010 | Saxler et al. | 257/192 |
| 2010/0264461 A1* | 10/2010 | Rajan et al. | 257/194 |

FOREIGN PATENT DOCUMENTS

| CN | 101162695 | 4/2008 |
| EP | 1978550 A1 * | 8/2008 |
| JP | 2008016762 | 1/2008 |

OTHER PUBLICATIONS

EP 1978550A1 (attached).*

* cited by examiner

*Primary Examiner* — Matthew Landau
*Assistant Examiner* — Latanya N Crawford
(74) *Attorney, Agent, or Firm* — Harness, Dickey & Pierce, P.L.C.

(57) ABSTRACT

A HEMT device and a manufacturing of the HEMT device, the HEMT device includes: a buffer layer (14) on the substrate (12); a semiconductor layer on the buffer layer (14); an isolation layer (16, 17) on the semiconductor layer; a source electrode (22) and a drain electrode (23) contacted with the semiconductor layer; and a gate electrode (24, 104 114) between the source electrode (22) and the drain electrode (23); wherein, a channel, which is located in the semiconductor layer below the gate electrode (24, 104, 114), is pinched off.

18 Claims, 5 Drawing Sheets

HEMT DEVICE AND A MANUFACTURING OF THE HEMT DEVICE

TECHNICAL FIELD

The present invention relates to a wide-bandgap semiconductor Gallium Nitride HEMT (high electron mobility transistor) device, and more particularly to a device structure design where polarization characteristic of a plurality of Gallium Nitride material layers is used to create an enhancement-mode field effect transistor.

TECHNICAL BACKGROUND

The dielectric breakdown voltage of third-generation semiconductor Gallium Nitride (GaN) is as high as 3MV/cm and is much higher than that of first-generation semiconductor silicon (Si) or second-generation semiconductor gallium arsenide (GaAs), and thus an electronic device of GaN can withstand a very high voltage. The channel of a GaN heterojunction structure has a very high electron concentration and very high electron mobility. This means that a Gallium Nitride high electron mobility transistor can conduct high current at high frequency and has a very low turn-on resistance. In addition, GaN is a wide bandgap semiconductor and may operate at high temperature. Those characteristics as described above make GaN HEMT especially suitable as a high frequency and high power radio frequency device, or as a high voltage switching device.

A gallium nitride HEMT is generally a depletion-mode field effect transistor or referred to as a normally-on device, since the AlGaN/GaN hetero-junction channel formed by piezoelectric and spontaneous polarizations has a very high concentration of two-dimensional electron gas (2DEG). There also exist normally-off devices, which also referred as enhancement-mode devices, in contrary to normally-on devices. The application of depletion-mode devices has limitations. In radio frequency power amplification area, a depletion-mode device must employ a negative bias voltage to the gate electrode, which requires the system to provide a completely independent power supply. In electrical power conversion filed, the application of a depletion-mode switching device not only needs an independent negative bias circuit as described above, but also requires the independent negative bias circuit to be powered up before the whole power conversation system is powered up, which is normally hard to realize. An enhancement-mode device is necessary in a power conversion system to avoid device failure by sudden rising of conducting current during system powering up.

Currently, normal methods to achieve an enhancement-mode gallium nitride HEMT include recessed gate structure, fluorine plasma bombardment treatment to the gate metal contact region, and so on. FIG. 1 shows a GaN HEMT having the recessed gate structure. A substrate 12 for growing the GaN material normally is sapphire, SiC or silicon. A nucleation layer 13 is grown on the substrate 12; a GaN epitaxial layer 101 is grown on the nucleation layer 13; an AlGaN layer 102 is grown on the GaN epitaxial layer 101. In this case, the two-dimensional electron gas (2DEG) may occur at the interface between the AlGaN and GaN layers and thus forms a channel. Two ohmic contacts form a source 22 and a drain 23 of the field effect transistor, respectively. In the region between the source 22 and the drain 23, the AlGaN is etched to form a trench, and then a metal gate 104 is formed in the trench. The trench and the metal gate formed therein is referred to as recessed gate structure. In the case that the AlGaN layer is thin enough, the 2DEG will be depleted, and therefore there is no electron in the channel under the gate. Such structure is referred to as an enhancement-mode field effect transistor since the channel thereof is pinched off under zero gate bias voltage. However, because of a very strong polarized electric field existing in the AlGaN layer, there may occur electrons in the channel even though the thickness of the AlGaN layer is very thin. As a result, for an enhancement-mode device with recessed gate structure, the thickness of the AlGaN layer under the metal gate must be thinned to a range of 3 nm to 5 nm, or below, by dry etching. It is very difficult to control an etching process with such a high accuracy. Thus, the pinch-off voltage of the device shows a large fluctuation. Moreover, the pinch-off effectiveness of such structure is limited because of a low pinch-off voltage, so there remains a small amount of channel leakage current even at zero bias. When the device operates at a high voltage, the channel leakage current can easily cause the burnout of the device. Therefore, such device structure is not practical.

FIG. 2 shows an enhancement-mode GaN HEMT with fluorine plasma bombardment treatment to the gate metal contact region. The processes prior to forming the source 22 and the drain 23 are the same as those of a recessed gate GaN HEMT. After forming the source and drain, the region under the gate is subjected to fluorine plasma bombardment prior to depositing the metal gate 114. The crystal structure of the AlGaN layer 115 subjected to the fluorine plasma bombardment is damaged, leading to depletion of 2DEG in the channel 118 under the AlGaN layer 115, and thus forming an enhancement-mode field effect transistor. The reliability of such device has not been verified since the crystal structure is damaged. Furthermore, the fluorine atom is small. In the case that the device operates at high temperature and high voltage conditions for a long period, the fluorine atom may be released from AlGaN. It is possible that the enhancement-mode transistor turns back to a depletion-mode transistor, causing the system using such device to fail and be damaged.

SUMMARY OF THE INVENTION

The present invention is proposed in view of the above problems in prior arts, the object of which is to provide a HEMT device and a method for manufacturing the HEMT device.

According to an aspect of the present invention, there is provided a HEMT device, comprising: a buffer layer on a substrate; a semiconductor layer on the buffer layer; an isolation layer on the semiconductor layer; a source and a drain which are in contact with the semiconductor layer; and a gate between the source and the drain; wherein, a channel in the semiconductor layer under the gate is pinched off.

Preferably, in the HEMT device as described above, the isolation layer has a bi-layer structure, and the gate is formed in the upper layer of the isolation layer.

Preferably, in the HEMT device as described above, the buffer layer includes AlGaN, a lower layer of the isolation layer includes AlGaN and the upper layer of the isolation layer includes AlGaN.

Preferably, in the HEMT device as described above, the Al composition of the lower layer of the isolation layer is close to the Al composition of the buffer layer, and the Al composition of the upper layer of the isolation layer is higher than the Al composition of the lower layer of the isolation layer.

Preferably, in the HEMT device as described above, the Al composition of the upper layer of the isolation layer gradually increases in the direction away from the lower layer of the isolation layer.

Preferably, in the HEMT device as described above, the Al composition of the buffer layer is between 5-15 atom %.

Preferably, in the HEMT device as described above, the Al composition of the upper layer of the isolation layer is between 25-45 atom %.

Preferably, in the HEMT device as described above, the semiconductor layer includes GaN.

Preferably, in the HEMT device as described above, the semiconductor layer has a thickness that does not cause a lattice relaxation of the semiconductor layer.

Preferably, in the HEMT device as described above, the thickness of the semiconductor layer is between 10-30 nm.

Preferably, in the HEMT device as described above, the channel includes a two-dimensional electron gas formed in the semiconductor layer, and the two-dimensional electron gas is not formed in a region where the channel is pinched off.

Preferably, in the HEMT device as described above, the gate electrode is formed between the source and drain electrodes by following process steps: at the gate position, the upper layer of the isolation layer is etched to form a trench; gate metal is formed on top of the trench with a field plate structure.

Preferably, in the HEMT device as described above, the trench has a slope.

Preferably, the HEMT device as described above further comprises a dielectric layer under the gate.

Preferably, in the HEMT device as described above, the dielectric layer includes SiN.

Preferably, the HEMT device as described above further comprises an etch stop layer between the upper and lower layers of the isolation layer.

Preferably, in the HEMT device as described above, the etch stop layer includes AlN.

Preferably, the HEMT device as described above further comprises a dielectric layer on the upper layer of the isolation layer, wherein the trench etch process step etches through the dielectric layer and etches into the upper layer of the isolation layer; then the gate metal is formed on top of the trench. Hence the gate electrode has a dual field plate structure.

Preferably, in the HEMT device as described above, the trenches have slopes, and the trench in the dielectric layer is wider than the below trench in the upper layer of the isolation layer.

Preferably, in the HEMT device as described above, the dielectric layer includes SiN.

According to an aspect of the present invention, there is provided an method for manufacturing a HEMT device, comprising steps of depositing a buffer layer on a substrate; depositing a semiconductor layer on the buffer layer; depositing a isolation layer on the semiconductor layer; forming a source and a drain which are in contact with the semiconductor layer; and forming a gate between the source and the drain; wherein, a channel in the semiconductor layer under the gate is pinched off.

Preferably, in the method for manufacturing a HEMT device as described above, the step of depositing the isolation layer on the semiconductor layer comprises the following steps: depositing a first isolation layer on the semiconductor layer; and depositing a second isolation layer on the first isolation layer.

Preferably, in the method for manufacturing a HEMT device as described above, the buffer layer includes AlGaN, the first isolation layer includes AlGaN and the second isolation layer includes AlGaN.

Preferably, in the method for manufacturing a HEMT device as described above, an Al composition of the first isolation layer is close to an Al composition of the buffer layer, and an Al composition of the second isolation layer is larger than the Al composition of the first isolation layer.

Preferably, in the method for manufacturing a HEMT device as described above, the Al composition of the first isolation layer gradually increases in the direction away from the first isolation layer.

Preferably, in the method for manufacturing a HEMT device as described above, the Al composition of the buffer layer is between 5-15 atom %.

Preferably, in the method for manufacturing a HEMT device as described above, the Al composition of the second isolation layer is between 25-45 atom %.

Preferably, in the method for manufacturing a HEMT device as described above, the semiconductor layer includes GaN.

Preferably, in the method for manufacturing a HEMT device as described above, the semiconductor layer has a thickness that does not cause a lattice relaxation of the semiconductor layer.

Preferably, in the method for manufacturing a HEMT device as described above, the thickness of the semiconductor layer is between 10-30 nm.

Preferably, in the method for manufacturing a HEMT device as described above, the channel includes a two-dimensional electron gas formed in the semiconductor layer, and the two-dimensional electron gas is not formed in a region under the gate where the channel is pinched off.

Preferably, in the method for manufacturing a HEMT device as described above, the step of forming the gate between the source and the drain comprises the following steps: etching the second isolation layer to form a trench at a position where the gate is formed; and forming the gate with a field plate structure on top of the trench.

Preferably, in the method for manufacturing a HEMT device as described above, the trench has a slope.

Preferably, the method for manufacturing a HEMT device as described above further comprises a step of: conformally forming a dielectric layer on the second isolation having the trench before the step of forming the gate with the field plate structure in the trench.

Preferably, in the method for manufacturing a HEMT device as described above, the dielectric layer includes SiN.

Preferably, the method for manufacturing a HEMT device as described above further comprises a step of depositing an etch stop layer on the first isolation layer before the step of depositing the second isolation layer on the first isolation layer.

Preferably, in the method for manufacturing a HEMT device as described above, the etch stop layer includes AlN.

Preferably, the method for manufacturing a HEMT device as described above further comprises the following steps: depositing a dielectric layer on the second isolation layer; etching the dielectric layer to form a first trench at a position where the gate is formed; etching the second isolation layer through the first trench to form a second trench; and forming the gate with a dual field plate structure on top of the first and the second trenches.

Preferably, in the method for manufacturing a HEMT device as described above, the first and the second trenches have slopes, and the first trench is wider than the second trench.

Preferably, in the method for manufacturing a HEMT device as described above, the dielectric layer includes SiN.

BRIEF DESCRIPTION OF THE DRAWINGS

It is believed that through following detailed description of the embodiments of the present invention, taken in conjunction with the drawings, above-mentioned features, advantages, and objectives will be better understood.

DETAILED DESCRIPTION OF THE INVENTION

Next, a detailed description of the preferred embodiments of the present invention will be given in conjunction with the drawings.

Figure 3:
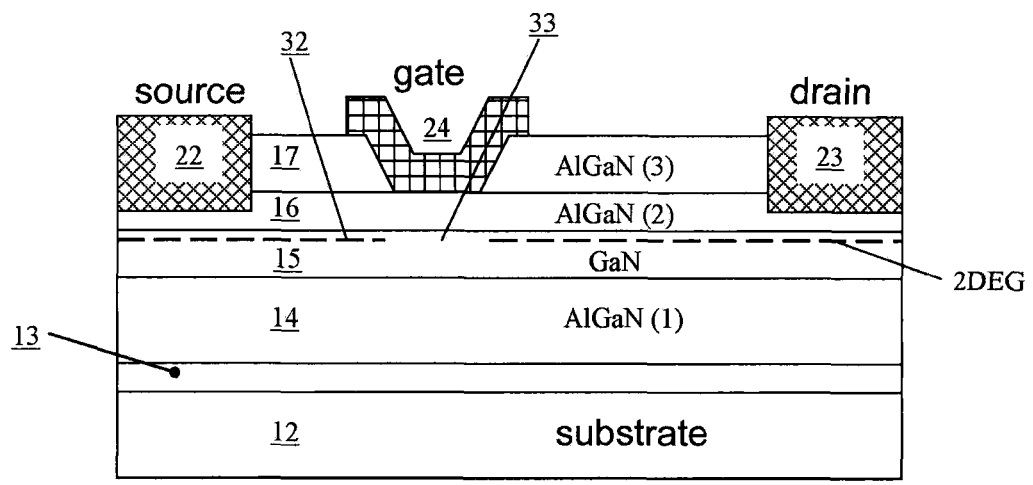
FIG. 3 shows a gallium nitride enhancement-mode field effect transistor structure according to the invention.

FIG. 3 shows a gallium nitride enhancement-mode field effect transistor structure according to the invention. The substrate 12 for growing gallium material normally includes Sapphire, SiC or Silicon. The nucleation layer 13 is grown on the substrate 12; unlike the prior gallium nitride device structure, AlGaN rather than GaN is used as a buffer layer of the device. On the buffer layer is a GaN channel layer 15. On the channel layer is a bi-layer AlGaN isolation layer which includes a second AlGaN layer 16 and a third AlGaN layer 17. The Al composition of the third AlGaN layer 17 is higher than that of the second AlGaN layer 16. Two ohmic contacts form a source 22 and a drain 23 of the field effect transistor, respectively. In the region between the source 22 and the drain 23, the third AlGaN layer is etched to form a trench, and then a metal gate 24 is formed on top of the trench formed by etching. Finally, a layer of dielectric such as SiN etc. is deposited on the device for passivation protection.

Figure 1:
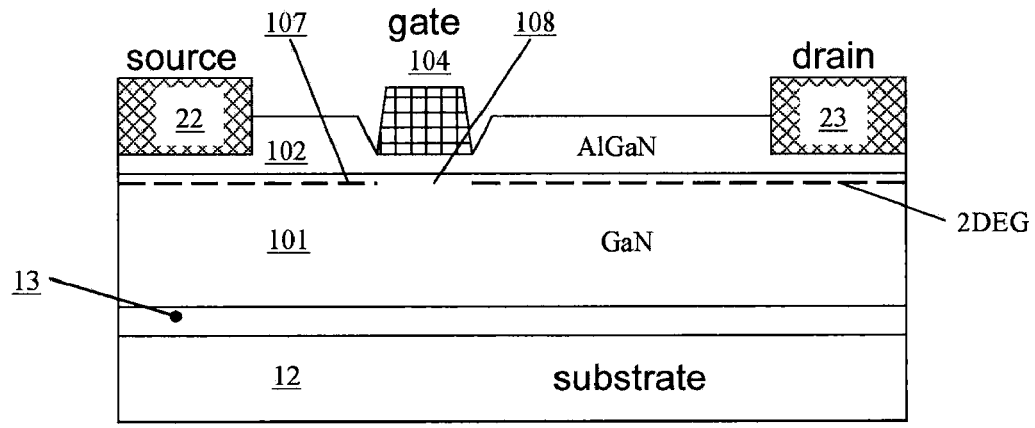
FIG. 1 shows a prior design of the enhancement-mode gallium nitride HEMT of recessed gate structure.
Figure 2:
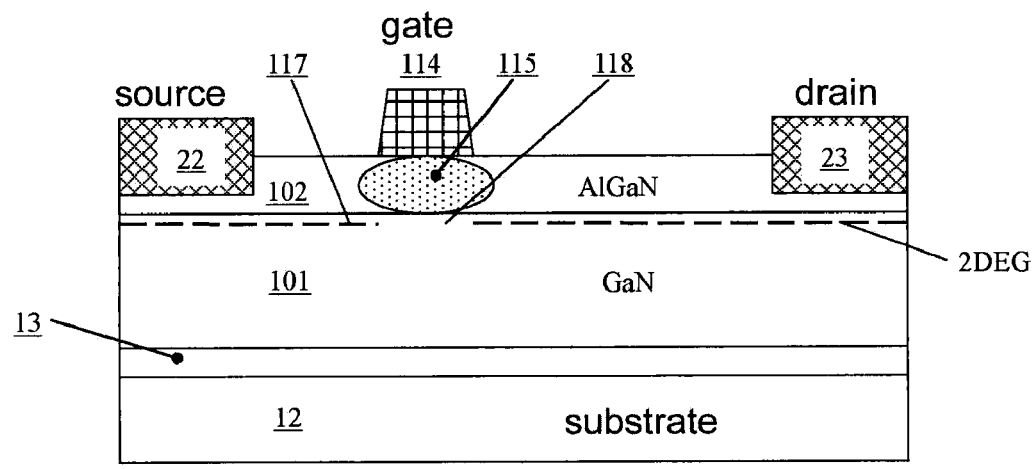
FIG. 2 shows a prior design of the enhancement-mode gallium nitride HEMT formed by fluorine plasma bombardment treatment to the gate metal contact region.

The gate 24 as shown in FIG. 3 is a kind of field plate structure. The gate metal can be deposited after the trench is etched or can be deposited by a self-aligned method when etching the trench. If the field plate is not employed, the recessed gate structure similar to the structure as shown in FIG. 1 can also be utilized, and the gate metal is deposited by a self-aligned method.

When etching the trench of the gate, the condition of the dry etching is optimized to cause the trench on the AlGaN layer to have a slope, such that the electron distribution in the channel is optimized to increase the breakdown voltage of the device.

Figure 4:
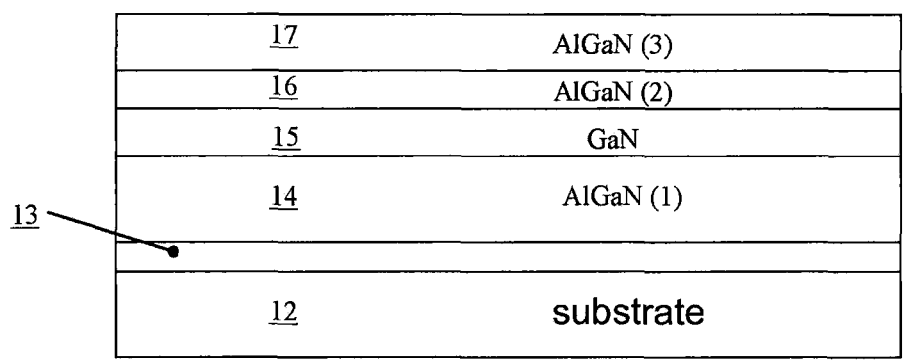
FIG. 4 shows a material structure for manufacturing a gallium nitride enhancement-mode field effect transistor of the invention.

FIG. 4 shows a material structure for manufacturing the gallium nitride enhancement-mode field effect transistor of the invention. The nucleation layer 13 normally is AlGaN or AlN, and then transits to the Al composition of the AlGaN buffer layer 14. The Al composition of the AlGaN buffer layer 14 is about 5 atom % to 15 atom %, the thickness of the buffer layer 14 is about 1 μm to 3 μm. The thickness of the GaN channel layer 15 is about 30 nm. The GaN grown on the AlGaN buffer layer has a compressive stress since GaN has a larger lattice constant than AlGaN. The thickness of the GaN channel layer 15 should not be too thick, and such layer of GaN should not be relaxed, so the thickness is normally about 10 nm to 30 nm. The Al composition of second AlGaN layer 16 is close to that of the AlGaN buffer layer 14, and the thickness of the second AlGaN layer 16 is about 20 nm. The Al composition of the third AlGaN layer 17 is higher than that of the second AlGaN layer 16 and is about 25 atom % to 45 atom %, and the thickness of the third AlGaN layer 17 is about 30 nm.

Figure 5:
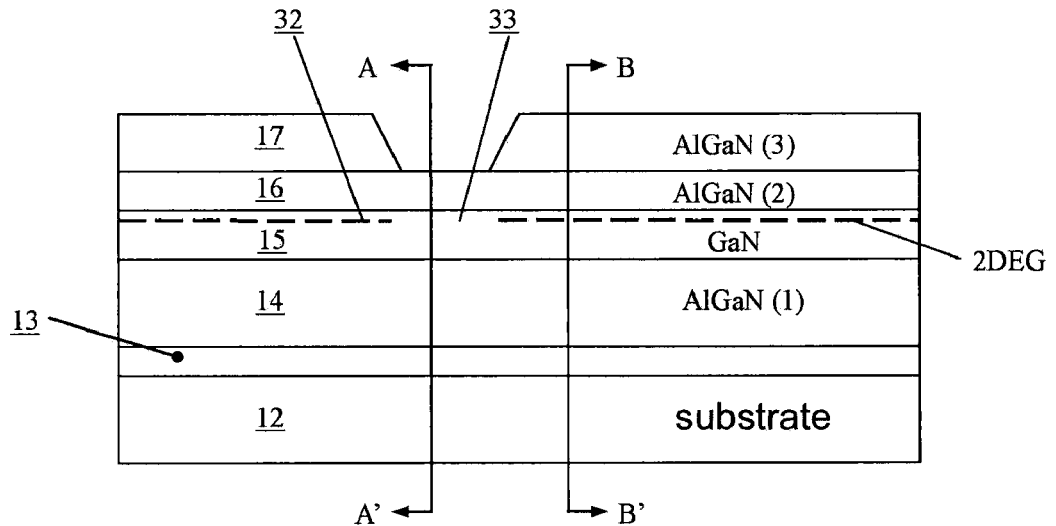
FIG. 5 shows a schematic diagram of the 2DEG in a channel depletion region and a channel access region.
Figure 6:
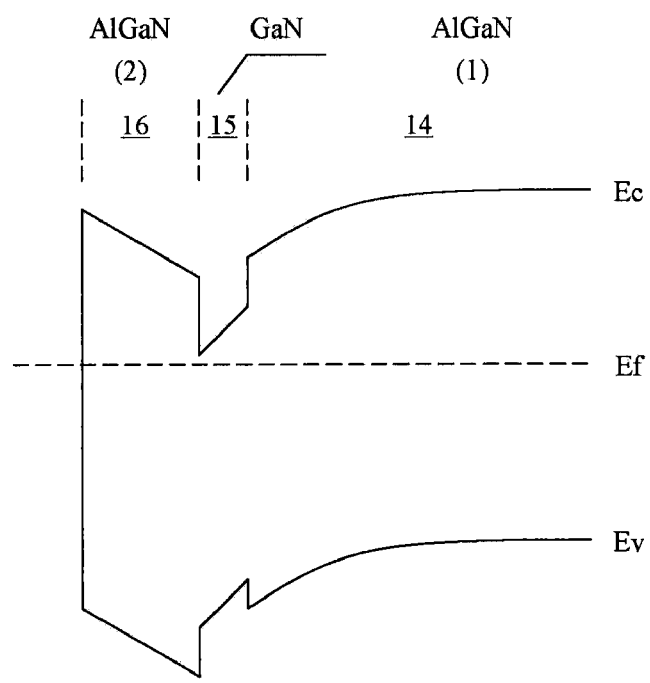
FIG. 6 shows a semiconductor energy band structure of the gate trench region in the A-A' section of FIG. 5.
Figure 7:
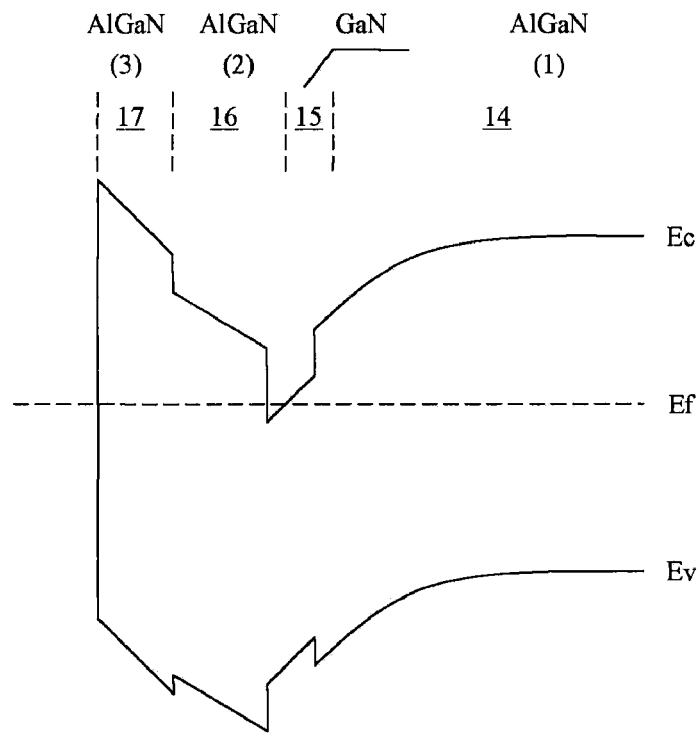
FIG. 7 shows a semiconductor energy band structure of the channel access region in the B-B' section of FIG. 5.

FIG. 5 shows that the two-dimensional electron gas (2DEG) in the channel in the gate trench region 33 is completely depleted, whereas the 2DEG still exists in the channel access region 32 where the trench is not etched. FIGS. 6 and 7 explain the mechanics of the two cases, respectively.

FIG. 6 shows a semiconductor energy band diagram of the gate trench region in the A-A' section of the device structure of FIG. 5. As described above, the thickness of the GaN channel layer 15 is not too thick so that the layer of GaN crystal is not relaxed and maintains the lattice constant of the underlying AlGaN buffer layer 14. The second AlGaN layer 16 maintains the lattice constant too. There is substantially no piezoelectric polarization field but spontaneous polarization field exists in the second AlGaN layer 16, since the Al composition of the second AlGaN layer 16 is close to that of the AlGaN buffer layer 14. As a result, the overall polarization field in the second AlGaN layer 16 is much lower than that in the AlGaN isolation layer of a normal gallium nitride HEMT structure. If the second AlGaN layer 16 is not intentionally doped, there needs a large thickness to induce a 2DEG in the channel. Compared with the prior design as shown in FIG. 1, the second AlGaN layer 16 under the gate metal can maintain about 20 nm, and thus the etching can be easily controlled. It is possible to attain a higher pinch-off voltage by suitably selecting the thickness of the second AlGaN layer 16, and the fluctuation of the pinch-off voltage is rather small. A higher pinch-off voltage means a low channel leakage current.

FIG. 7 shows a semiconductor energy band diagram of the channel access region in the B-B' section in the device structure of FIG. 5. There is not only spontaneous polarization field but also piezoelectric polarization field in the third AlGaN layer 17, since the Al composition of the third AlGaN layer 17 is higher than that of the second AlGaN layer 16. The strong polarization field causes the conduction band of the third AlGaN layer 17 to increase rapidly as the thickness of the third AlGaN layer 17 increases. When the middle energy band of the material surface rises higher than the Fermi-level, the 2DEG starts to be induced in the channel.

A modification of the invention is that, the Al composition of the third AlGaN layer 17 is designed as a gradual structure where the Al composition is gradually increased from bottom to top. The advantage of doing such is that, the thickness of the third AlGaN layer 17 can be made much thicker, which is suitable for forming the field plate gate structure as shown in FIG. 3.

Figure 8:
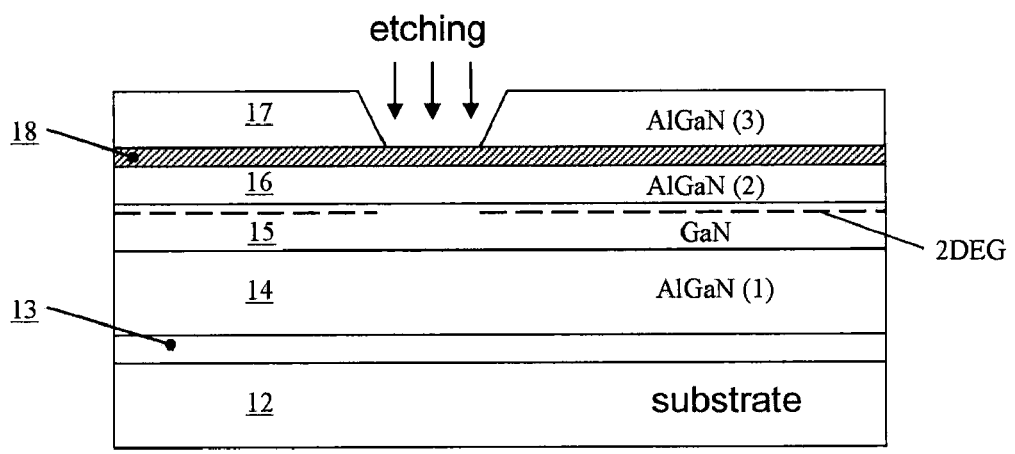
FIG. 8 shows a modification of the invention in which an etch stop layer is used to accurately control the depth of etching.

Another modification of the invention is that, an etch stop layer 18 is added between the second AlGaN layer 16 and the third AlGaN layer 17, as shown in FIG. 8. The etch stop layer normally includes AlN or AlGaN having a high aluminum composition, and has a thickness of about 1 to 3 nm. When the RIE dry etching is used to form the trench, the etch depth can be positioned accurately at the depth of such layer of AlN since the etching rate of AlN is lower than that of the third AlGaN. Accurate etch control may reduce the fluctuation of the device pinch-off voltage, and therefore improve product yield.

Figure 9:
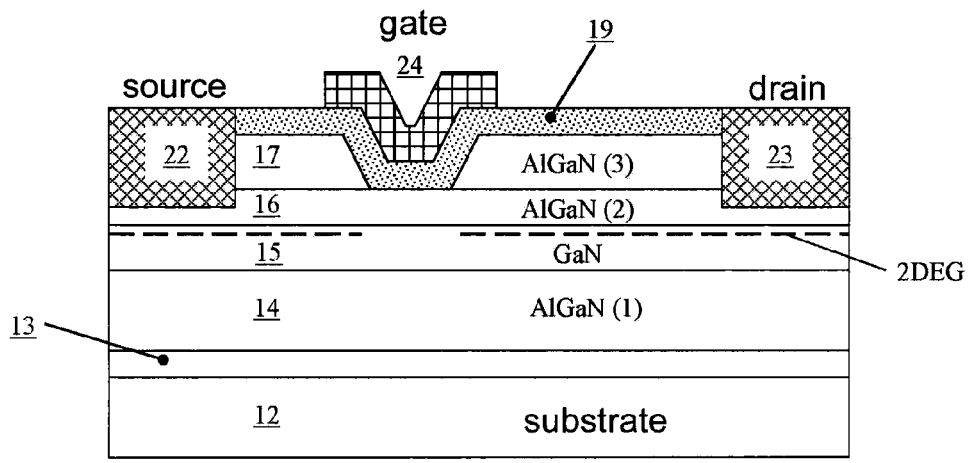
FIG. 9 shows a modification of the invention which is a MISFET structure.

Another modification of the invention is employment of a MISFET (Metal-Insulator-Semiconductor Field-effect-Transistor) structure, as shown in FIG. 9. A layer of dielectric such as SiN and so on with a thickness of about 5-15 nm is deposited on the third AlGaN layer 17 after the trench is etched for the gate and before the gate metal is deposited. The layer of dielectric functions both a device passivation layer and a gate insulating layer, and can reduce the leakage current of the gate effectively.

Figure 10:
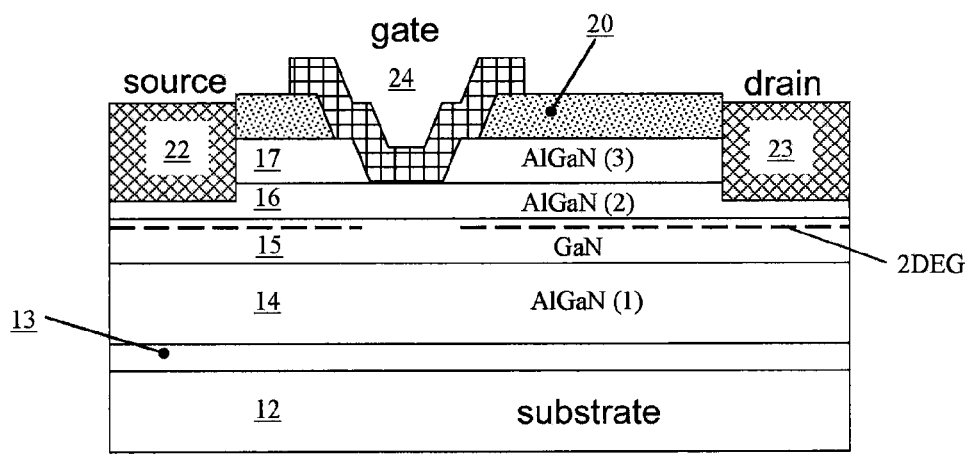
FIG. 10 shows a modification of the invention which has a dual field plate structure.

Another modification of the invention is a dual field plate structure, as shown in FIG. 10. In such structure, an insulator 20 has a thickness of about 50-200 nm, and its material is a dielectric such as SiN etc. The trench in the insulator 20 is over the trench in the third AlGaN layer 17, and the width of the trench in the insulator 20 is slightly wider than that of the trench in the third AlGaN layer 17. The two trenches are covered with the gate metal, and the dual field plate structure is formed at the edges of the two trenches. The breakdown voltage of the device can be further improved by the dual field plate structure.

Though the HEMT device and the method for manufacturing the HEMT device have been described in details with some exemplary embodiments, these above embodiments are not exhaustive. Those skilled in the art may make various variations and modifications within the spirit and scope of the present invention. Therefore, the present invention is not limited to these embodiments; rather, the scope of the present invention is only defined by the appended claims. For example, while the description is made by illustratively employing AlGaN as the buffer layer and the isolation layer, it should be understood that the other gallium nitride-based compounds, which are well known to those skilled in the art, can also be used, therefore, the present invention has no restrictions for this.

The invention claimed is:

1. A high electron mobility transistor (HEMT) device, comprising:
   a buffer layer on a substrate, the buffer layer including AlGaN;
   a semiconductor layer on the buffer layer;
   an isolation layer on the semiconductor layer, the isolation layer having a bi-layer structure including a lower layer and an upper layer, each of the lower layer and the upper layer including AlGaN, an Al composition of the lower layer being close to an Al composition of the buffer layer, an Al composition of the upper layer being higher than the Al composition of the lower layer;
   a source and a drain which are in contact with the semiconductor layer;
   a trench between the source and the drain, the trench being formed in the isolation layer; and
   a gate formed in the trench,
   wherein a channel in the semiconductor layer under the gate is pinched off.

2. The HEMT device according to claim 1, wherein the trench is formed in the upper layer of the isolation layer.

3. The HEMT device according to claim 1, wherein the Al composition of the upper layer of the isolation layer gradually increases in the direction away from the lower layer of the isolation layer.

4. The HEMT device according to claim 1, wherein the Al composition of the buffer layer is between 5-15 atom %.

5. The HEMT device according to claim 1, wherein the Al composition of the upper layer of the isolation layer is between 25-45 atom %.

6. The HEMT device according to claim 1, wherein the semiconductor layer includes GaN.

7. The HEMT device according to claim 1, wherein a two-dimensional electron gas is formed in a region of the semiconductor layer above which the trench is not formed, and the two-dimensional electron gas is not formed in a region of the semiconductor layer above which the trench is formed.

8. The HEMT device according to claim 1, wherein the gate has a field plate structure.

9. The HEMT device according to claim 1, further comprising an etch stop layer between the upper and lower layers of the isolation layer.

10. The HEMT device according to claim 1, further comprising a dielectric layer on the upper layer of the isolation layer, wherein the gate has a dual field plate structure formed in the trench in the isolation layer and a trench in the dielectric layer.

11. The HEMT device according to claim 6, wherein the semiconductor layer has a thickness that does not cause a lattice relaxation of the semiconductor layer.

12. The HEMT device according to claim 11, wherein the thickness of the semiconductor layer is between 10-30 nm.

13. The HEMT device according to claim 8, wherein the trench has a slope.

14. The HEMT device according to claim 8, further comprising a dielectric layer under the gate.

15. The HEMT device according to claim 14, wherein the dielectric layer includes SiN.

16. The HEMT device according to claim 9, wherein the etch stop layer includes AlN.

17. The HEMT device according to claim 10, wherein the trenches have slopes, and the trench in the dielectric layer is wider than the trench in the isolation layer.

18. The HEMT device according to claim 10, wherein the dielectric layer includes SiN.

\* \* \* \* \*

UNITED STATES PATENT AND TRADEMARK OFFICE
CERTIFICATE OF CORRECTION

PATENT NO. : 8,304,811 B2
APPLICATION NO. : 12/997519
DATED : November 6, 2012
INVENTOR(S) : Zhang Page 1 of 1

It is certified that error appears in the above-identified patent and that said Letters Patent is hereby corrected as shown below:

Column 3, line 33, replace "MN" with "AIN".

Signed and Sealed this
Fifteenth Day of January, 2013

David J. Kappos
*Director of the United States Patent and Trademark Office*